(12) United States Patent
Huang et al.

(10) Patent No.: US 9,513,677 B2
(45) Date of Patent: Dec. 6, 2016

(54) SHAPED BACKPLANE FOR RECEIVING ELECTRICAL COMPONENTS

(71) Applicant: HGST Netherlands B.V., Amsterdam (NL)

(72) Inventors: Lidu Huang, Danville, CA (US);
Toshiki Hirano, San Jose, CA (US);
Jeffrey Wilke, Palmer Lake, CO (US);
Jin Hui Ou-Yang, San Jose, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 224 days.

(21) Appl. No.: 14/218,835

(22) Filed: Mar. 18, 2014

(65) Prior Publication Data

US 2015/0268702 A1    Sep. 24, 2015

(51) Int. Cl.
| | | |
|---|---|---|
| *H05K 1/14* | (2006.01) | |
| *H05K 7/06* | (2006.01) | |
| *H05K 3/30* | (2006.01) | |
| *G06F 1/18* | (2006.01) | |
| *H05K 3/40* | (2006.01) | |
| *H05K 1/18* | (2006.01) | |
| *H05K 1/02* | (2006.01) | |

(52) U.S. Cl.
CPC ............... *G06F 1/187* (2013.01); *H05K 1/189* (2013.01); *H05K 3/4007* (2013.01); *H05K 1/0271* (2013.01); *H05K 2201/09081* (2013.01); *H05K 2201/10189* (2013.01); *Y10T 29/49* (2015.01)

(58) Field of Classification Search
CPC ............... H05K 1/14; H05K 7/06; H05K 3/30; G06F 1/187

USPC .................................................. 361/785–789
See application file for complete search history.

(56) References Cited

U.S. PATENT DOCUMENTS

| | | |
|---|---|---|
| 2,272,807 A | 2/1942 | Kronheim |
| 4,841,100 A | 6/1989 | Ignasiak |
| 5,761,031 A | 6/1998 | Ajmani |
| 5,995,365 A | 11/1999 | Broder et al. |
| 6,084,768 A | 7/2000 | Bolognia |
| 6,166,901 A | 12/2000 | Gamble et al. |
| 6,209,842 B1 | 4/2001 | Anderson et al. |

(Continued)

OTHER PUBLICATIONS

Intel® Server System SR2612UR Service Guide http://download.intel.com/support/motherboards/server/s5520ur/sb/r2612ur_service_guide_14.pdf.

(Continued)

*Primary Examiner* — Eric Thomas
*Assistant Examiner* — Michael P McFadden

(57) ABSTRACT

A backplane configured to receive electrical components is provided. The backplane in one example includes a substantially planar substrate comprising an at least partially flexible material and formed in a non-rectangular shape, a series of alternating connector islands formed along two substantially parallel axes, wherein each connector island is able to move independently of other connector islands, a plurality of backplane traces extending from the series of alternating connector islands to a backplane connector region of the substrate, with a number of backplane traces increasing closer to the backplane connector region, and one or more spring elements bridging between a particular connector island and the substrate, with the one or more spring elements allowing the particular connector island to flex with respect to the substrate and absorb vibrations.

20 Claims, 18 Drawing Sheets

(56) References Cited

U.S. PATENT DOCUMENTS

| | | |
|---|---|---|
| 6,288,902 B1 | 9/2001 | Kim et al. |
| 6,371,433 B2 | 4/2002 | Anderson et al. |
| 6,592,387 B2 | 7/2003 | Komenda et al. |
| 6,987,674 B2 | 1/2006 | El-Batal et al. |
| 7,009,835 B2 | 3/2006 | Desai et al. |
| 8,508,928 B2 | 8/2013 | Killen et al. |
| 8,931,748 B2 | 1/2015 | Bowman et al. |
| 2008/0104280 A1 | 5/2008 | Biskeborn |
| 2013/0199295 A1 | 8/2013 | Hoefer et al. |
| 2014/0362515 A1* | 12/2014 | Pronozuk ............ H05K 7/1488 361/679.31 |

OTHER PUBLICATIONS

Synology DiskStation DS213+ http://www.xtremesystems.org/forums/showthread.php?282802-Synology-DiskStation-DS213.

* cited by examiner

SHAPED BACKPLANE FOR RECEIVING ELECTRICAL COMPONENTS

BACKGROUND OF THE INVENTION

Field of the Invention

Aspects of the disclosure are related to a shaped backplane for receiving electrical components.

Description of the Related Art

As computer systems and networks grow in numbers and capability, there is a need for more and more storage system capacity. Cloud computing and large-scale data processing have further increase the need for digital data storage systems that are capable of transferring and holding immense amounts of data.

One approach to providing sufficient data storage is the use of arrays of Hard Disk Drives (HDDs). A number of HDDs can be held in a container, sometimes referred to as a sled. A sled is a modular unit that can hold and operate a number of HDDs. The HDDs are held an operated in close proximity within the sled, so that as many HDDs as possible can be fit into a defined volume. A sled may hold tens of HDDs within an enclosure, with the enclosure including an external connector that is electrically coupled to all of the included HDDs. The enclosure can also include fans or other cooling devices. Multiple sleds can be installed in racks or other support structures. Consequently, storage capacity can be increased in large increments by the installation of an additional sled or sleds.

HDDs include a spinning disk that is typically rotated at a speed of 7,200 RPM, for example. Rotation speed has increased as HDDs have been improved and refined, and will likely rotate at even higher RPM values in the future. A read head is moved inward or outward from the center of the spinning disk in order to read and write data on the disk. These moving components can generate vibrations in the HDD.

When a number of HDDs are included within a sled, which typically includes rigid structural members, the vibrations generated by one HDD can be transferred to other HDDs within the sled. The transferred vibrations can interfere with operations of the affected HDD or HDDs. The transferred vibrations can disrupt or block the read and write operations in an affected HDD. The transferred vibrations can combine with local vibrations already produced by the affected HDD to produce stronger and more disruptive vibrations than where the affected HDD is operating in isolation. The transferred vibrations can cause increase wear and breakage in components of the affected HDD.

SUMMARY OF THE INVENTION

A backplane configured to receive electrical components is provided. The backplane in one example includes a substantially planar substrate comprising an at least partially flexible material and formed in a non-rectangular shape, a series of alternating connector islands formed along two substantially parallel axes extending substantially lengthwise on the substrate and wherein each connector island is able to move independently of other connector islands, with pairs of connector islands of the series of connector islands located in openings in the substrate and configured to receive one or more mating electrical components, a plurality of backplane traces formed as part of the substrate, with the plurality of backplane traces extending from the series of alternating connector islands to a backplane connector region of the substrate, with a number of backplane traces increasing closer to the backplane connector region, and one or more spring elements bridging between a particular connector island and the substrate, with traces of the plurality of backplane traces extending over the one or more spring elements to the particular connector island and with the one or more spring elements allowing the particular connector island to flex with respect to the substrate and absorb vibrations.

DETAILED DESCRIPTION OF THE INVENTION

The following description and associated drawings teach the best mode of the invention. For the purpose of teaching inventive principles, some conventional aspects of the best mode may be simplified or omitted. The following claims specify the scope of the invention. Some aspects of the best mode may not fall within the scope of the invention as specified by the claims. Thus, those skilled in the art will appreciate variations from the best mode that fall within the scope of the invention. Those skilled in the art will appreciate that the features described below can be combined in various ways to form multiple variations of the invention. As a result, the invention is not limited to the specific examples described below, but only by claims and their equivalents.

Figure 1:
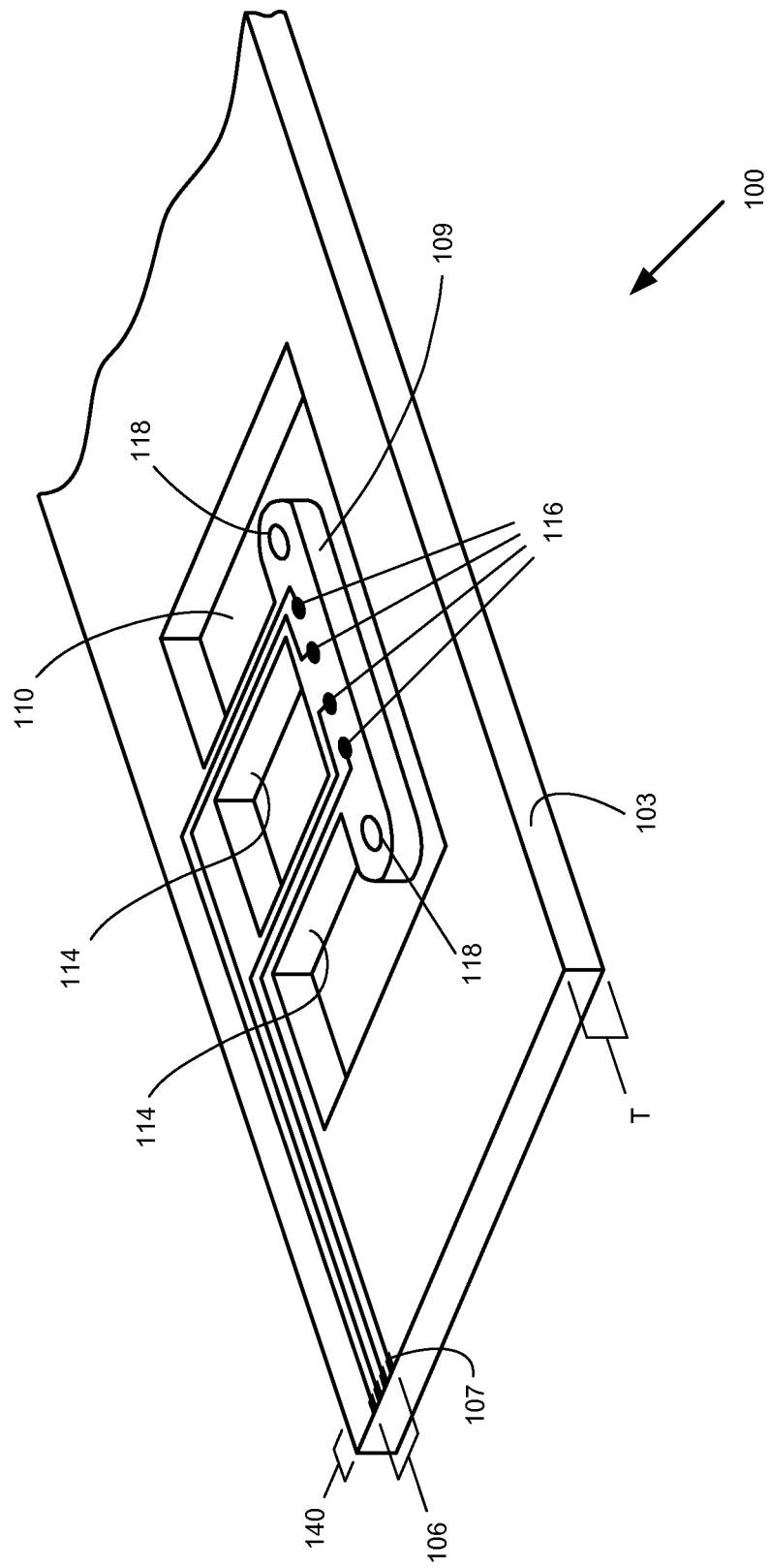
FIG. 1 shows a portion of an exemplary backplane.

FIG. 1 shows a portion of an exemplary backplane 100. The backplane 100 comprises a backplane for receiving and coupling to a plurality of electrical components, including a plurality of identical electrical components in some examples. The backplane 100 in some examples is configured to receive multiple rows and columns of electrical components. In one example, the plurality of electrical components comprises a plurality of Hard Disk Drives (HDDs) that couple to an assembled and completed backplane 100. However, other or additional electrical components are contemplated and are within the scope of the description and claims.

The backplane 100 comprises a substrate 103. The substrate 103 is at least partially flexible, wherein the backplane 100 can be flexed or deformed. A plurality of backplane traces 106 are formed on or in the substrate 103. The plurality of backplane traces 106 can terminate in a corresponding plurality of backplane trace pads 107. The plurality of backplane trace pads 107 can be formed at or on an edge of the substrate 103, as shown, but can also be formed at other locations on the substrate 103. In some examples, the plurality of backplane trace pads 107 can comprise a backplane connector region 140, wherein a connector component or components can be affixed to the substrate 103 or wherein the plurality of backplane trace pads 107 comprise contacts that are configured to mate with outside connectors or devices (such as backplane connector 564 of a component cartridge 560 of FIG. 13).

The substrate 103 has a thickness T. The substrate 103 can be formed of any suitable material, including plastics, ceramics, or other material wherein the substrate 103 is at least partially flexible. The substrate 103 in some examples comprises an electrical insulator or dielectric material. The backplane 100 in some examples can comprise a single-sided, double-sided, or multi-layer Printed Circuit Board (PCB).

The backplane 100 in the figure has a generally rectangular and planar shape. However, it should be understood that the backplane 100 can be formed in any suitable shape.

The backplane 100 further includes an opening 110 formed in the substrate 103. The opening 110 is shown as being substantially rectangular, but can be of any suitable shape. A connector island 109 is located in the opening 110. A connector component 122 can be affixed to the connector island 109 (see FIG. 3).

One or more spring elements 114 bridge between the connector island 109 and the substrate 103. In some examples, the one or more spring elements comprise two spring elements 114. The one or more spring elements 114 are formed from the substrate 103 and are configured to be at least partially flexible, wherein the connector island 109 can be displaced up and down with respect to the substrate 103. The one or more spring elements 114 allow the connector island 109 to flex with respect to the substrate 103. The one or more spring elements 114 therefore allow the connector island 109 to absorb vibrations and be at least partially vibrationally isolated from the substrate 103. The one or more spring elements 114 enable the connector island 109 to vibrate without transmitting vibrations from the connector island 109 to the substrate 103. Conversely, the one or more spring elements 114 allow the substrate 103 to vibrate without transmitting vibrations from the substrate 103 to the connector island 109.

The one or more spring elements 114 can be formed in any desired shape. Other examples of spring element configurations are given below (see FIGS. 6-12 and the accompanying text). The one or more spring elements 114 can be formed in any desired widths. The one or more spring elements 114 can be configured to provide optimal flexibility. The one or more spring elements 114 can be configured to achieve a desired resonant (or natural) frequency.

At least some traces of the plurality of backplane traces 106 extend over the one or more spring elements 114 to the connector island 109. The traces can terminate in connector trace pads 116. The connector trace pads 116 can be affixed to pins or other conductors 130 of a connector component 122.

In one example, a backplane 100 configured to receive electrical components includes a substrate 103 comprising an at least partially flexible material, a plurality of backplane traces 106 formed as part of the substrate 103, at least one connector island 109 formed in the substrate 103, with the at least one connector island 109 located in an opening 110 in the substrate 103 and configured to receive at least one mating electrical component 200, and one or more spring elements 114 bridging between the at least one connector island 109 and the substrate 103, with traces of the plurality of backplane traces 106 extending over the one or more spring elements 114 to the at least one connector island 109 and with the one or more spring elements 114 allowing the at least one connector island 109 to flex with respect to the substrate 103 and absorb vibrations.

In some examples, the opening 110 containing the connector island 109 is sized to accommodate a mating electrical component 200 to be received by the connector island 109. In some examples, the opening 110 containing the connector island 109 is sized to accommodate a mating electrical component 200 to be received by the connector island 109, wherein the electrical component 200 can vibrate without contacting a portion of the substrate 103.

Figure 2:
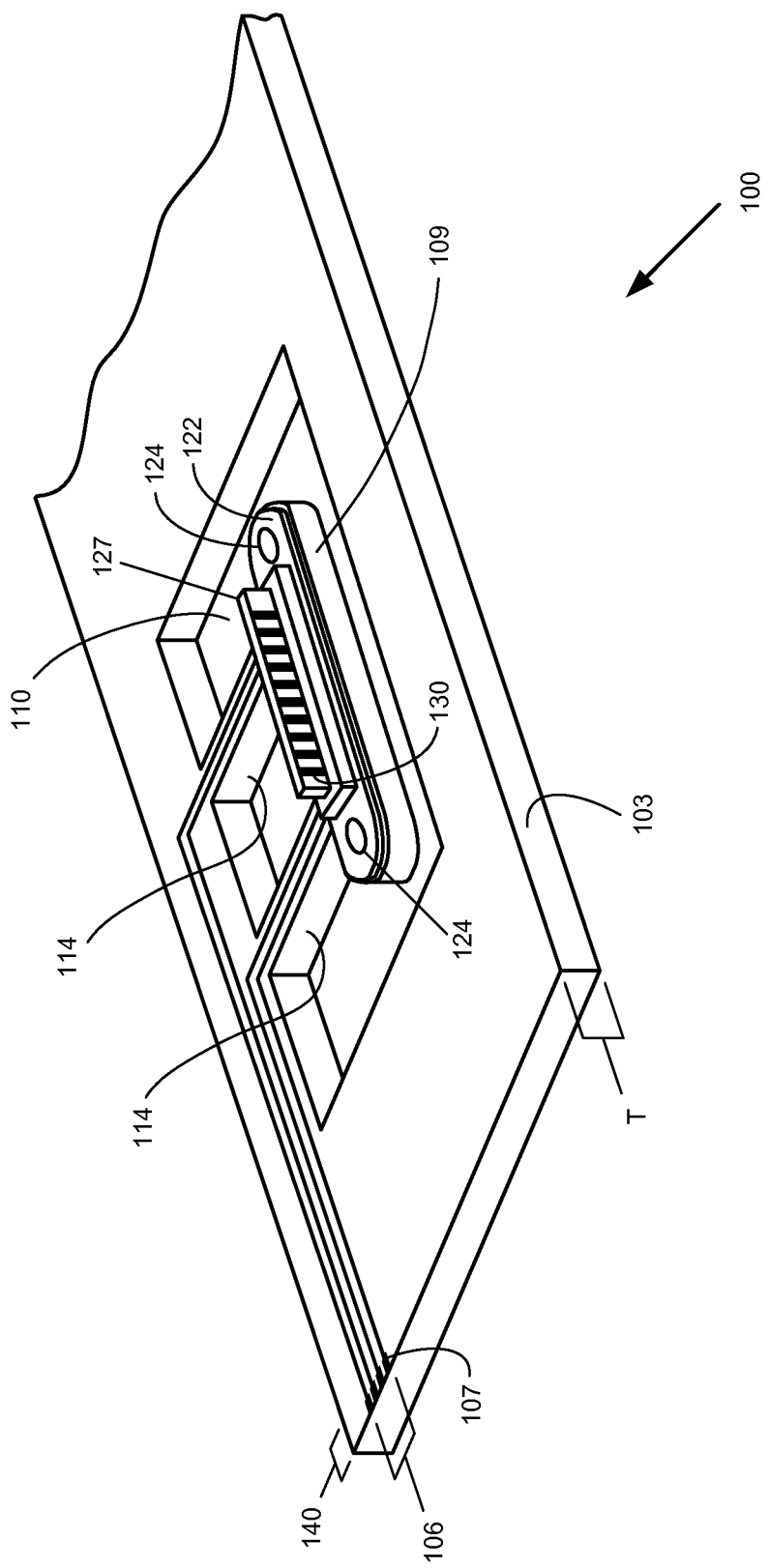
FIG. 2 shows the backplane with a connector component affixed to the connector island.

FIG. 2 shows the backplane 100 with a connector component 122 affixed to the connector island 109. The connector component 122 can be permanently or removably affixed to the connector island 109. The connector component 122 can include connector bores 124 that substantially align with the connector bores 118 of the connector island 109. The connector component 122 can be affixed to the connector island 109 by any suitable method, including adhesives or bonding agents, welds, soldering, fasteners including devices such as dowels/pins, screws, bolts and nuts, or rivets, for example, springs, clips, snap fixtures, or any other suitable fasteners or attachment devices.

The connector component 122 in the example shown includes a connector projection 127 including one or more exposed conductors 130. The conductors 130 can comprise traces, contacts, pins, or other suitable connector conductors. The conductors 130 include portions that make electrical contact with the connector trace pads 116 of the connector island 109. In some examples, the portions of the conductors 130 are soldered to (or otherwise affixed to) the connector trace pads 116.

A corresponding connector portion of a mating electrical component 200 fits to the connector component 122. The corresponding connector portion of the mating electrical component 200 fit over the connector projection 127 and makes electrical contact with some or all of the conductors 130.

In some examples, the at least one connector island comprises two or more offset connector islands 109 formed along two substantially parallel axes extending substantially lengthwise on the substrate 103. In other examples, the at least one connector island comprises a series of alternating connector islands 109 formed along two substantially parallel axes extending substantially lengthwise on the substrate 103. In yet other examples, the at least one connector island comprises a series of alternating connector islands 109 and wherein each connector island is able to move independently of other connector islands.

Figure 3:
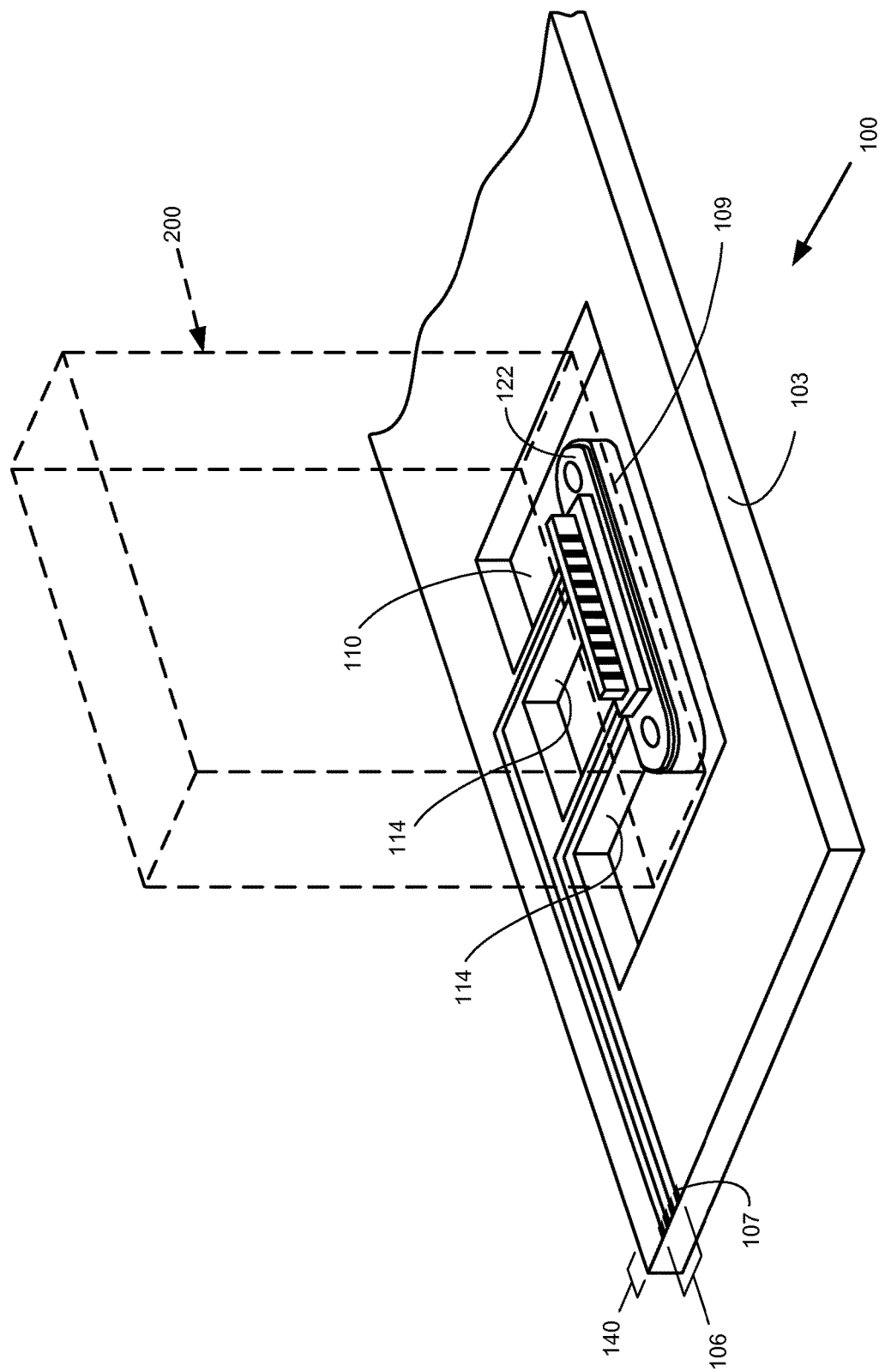
FIG. 3 shows the backplane wherein a mating electrical component (dashed lines) is assembled to the backplane.

FIG. 3 shows the backplane 100 wherein the mating electrical component 200 (dashed lines) is assembled to the backplane 100. The mating electrical component 200 fits down over the connector component 122. As a result, one or more electrical connections are formed between the backplane 100 and the mating electrical component 200. Consequently, the backplane 100 can provide electrical power to the mating electrical component 200. Further, the backplane 100 can exchange electrical signals with the mating electrical component 200, including exchanging data with the mating electrical component 200. The electrical power and/or electrical signals can therefore be exchanged over the plurality of backplane traces 106.

It can be seen that the connector island 109 can be displaced relative to the substrate 103. The connector island 109 can be displaced upward or downward. In some examples, the opening 110 can be sized to accommodate the mating electrical component 200. The opening 110 can be configured to allow the mating electrical component 200 to vibrate without contacting a portion of the substrate 103. Therefore, the connector island 109 can absorb vibrations and can provide vibration isolation. The connector island 109 can allow the electrical component 200 to vibrate at least somewhat, and can isolate and not transfer the vibration of the electrical component 200 to the substrate 103. Alternatively, the connector island 109 can allow the substrate 103 to vibrate and not allow the vibration to be transferred from the substrate 103 to the mating electrical component 200.

Figure 4:
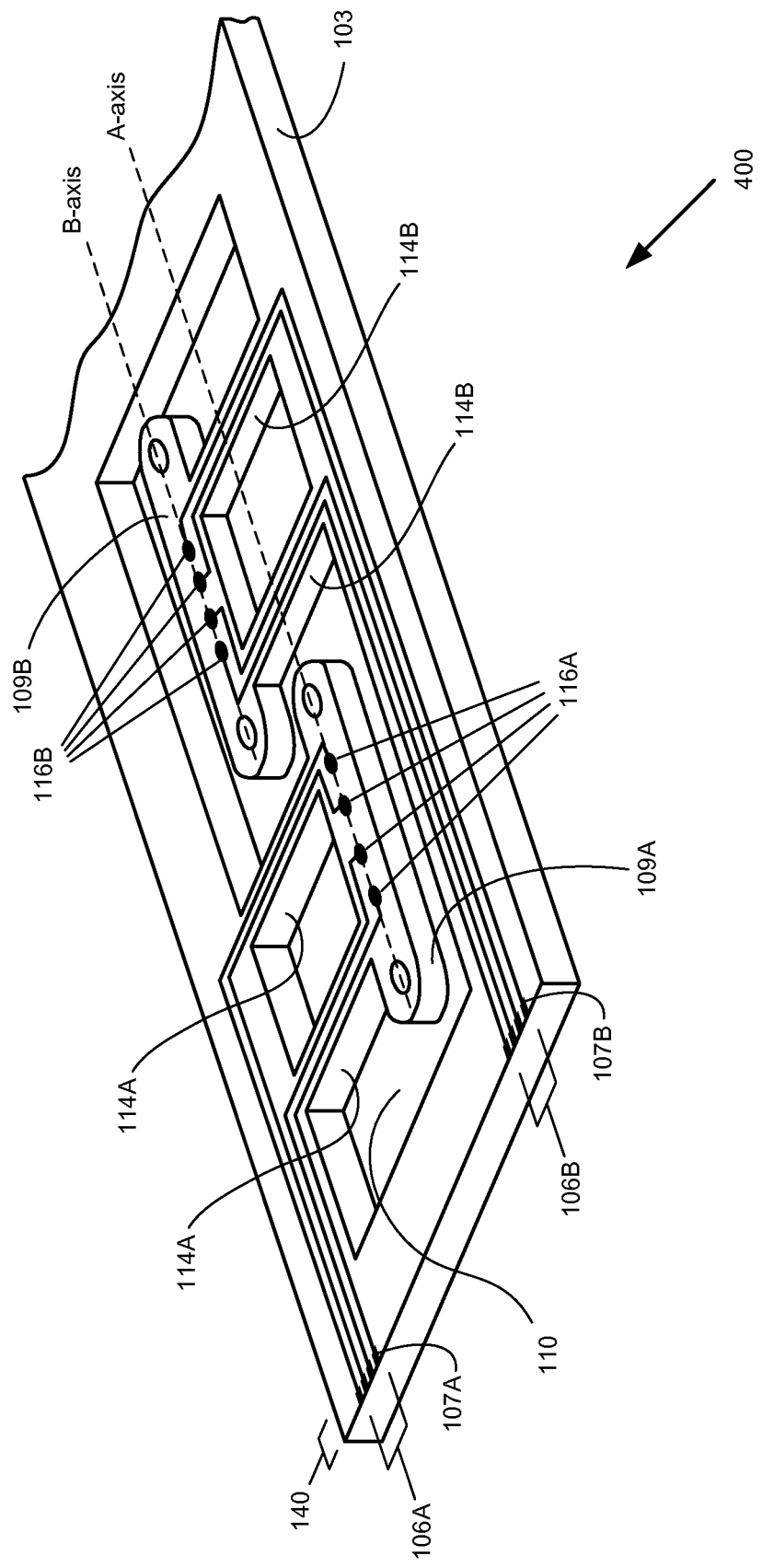
FIG. 4 shows an exemplary backplane including two offset connector islands.

FIG. 4 shows an exemplary backplane 100 including two offset connector islands 109A and 109B. The second connector island 109B includes connector trace pads 116B coupled to a plurality of backplane traces 106B and backplane trace pads 107B. The connector trace pads 116B in this example are located on the opposite side of the opening 110. The connector island 109B is therefore substantially symmetric with the connector island 109A in the example shown.

The connector island 109B can deform or vibrate in synchronicity with a deformation or vibration in the connector island 109A. Alternatively, the connector island 109B can deform or vibrate independent of the deformation or vibration in the connector island 109A.

It should be understood that the backplane 100 may include more than two connector islands 109. For example, one or both of the A-axis and the B-axis may comprise a row of multiple connector islands (see FIGS. 7-8, for example).

In some examples, the span of the connector island 109B can at least partially overlap the span of the connector island 109A, as can be seen from the figure. Consequently, an electrical component 200B received by the connector island 109B will at least partially overlap an electrical component 200A received by the connector island 109A.

The connector island 109A is centered on an A-axis, while the connector island 109B is centered on a B-axis. The B-axis in some examples is laterally spaced from and is substantially parallel to the A-axis. As a result of the lateral offset, both connector islands 109A and 109B can receive electrical components 200A and 200B. In addition, the two connector islands 109A and 109B can be axially offset, wherein the center of the electrical component 200B is axially spaced (i.e., along the B-axis) from the center of the electrical component 200A. Alternatively, the electrical components 200A and 200B can be substantially aligned, with their centers at the same position (see FIG. 13). Consequently, the electrical component 200A received by the connector island 109A can move independently of the electrical component 200B received by the connector island 109B.

The lateral offset distance between the A-axis and the B-axis can vary. The lateral offset distance can depend on the size of the connector components 122, the size of the mating electrical components 200, desired assembly tolerances, cooling considerations and desired airflow characteristics, and/or other factors. In some examples, the lateral offset distance between the A-axis and the B-axis can be chosen to accommodate electrical components of different thicknesses. A backplane 100 designed to receive two different electrical component thicknesses may require a different lateral offset distance than a backplane 100 designed to receive electrical components of only a single thickness.

In some examples, the at least one connector island comprises two or more offset connector islands 109 formed along two substantially parallel axes extending substantially lengthwise on the substrate 103. In other examples, the at least one connector island comprises a series of alternating connector islands 109 formed along two substantially parallel axes extending substantially lengthwise on the substrate 103. In yet other examples, the at least one connector island comprises a series of alternating connector islands 109 and wherein each connector island is able to move independently of other connector islands. In yet other examples, the at least one connector island comprises a series of alternating connector islands 109 formed along two substantially parallel axes extending substantially lengthwise on the substrate 103 and with a first connector island of a first axis being laterally spaced from an adjacent second connector island of a second axis.

In one example, a backplane 100 configured to receive electrical components includes a substrate 103 comprising an at least partially flexible material, a plurality of backplane traces 106 formed as part of the substrate 103, a series of alternating connector islands 109 formed along two substantially parallel axes extending substantially lengthwise on the substrate 103 and wherein each connector island is able to move independently of other connector islands, with pairs of connector islands of the series of connector islands 109 located in openings 110 in the substrate 103 and configured to receive one or more mating electrical components 200, and one or more spring elements 114 bridging between a particular connector island 109 and the substrate 103, with traces of the plurality of backplane traces 106 extending over the one or more spring elements 114 to the particular connector island 109 and with the one or more spring elements 114 allowing the particular connector island 109 to flex with respect to the substrate 103 and absorb vibrations.

Figure 5:
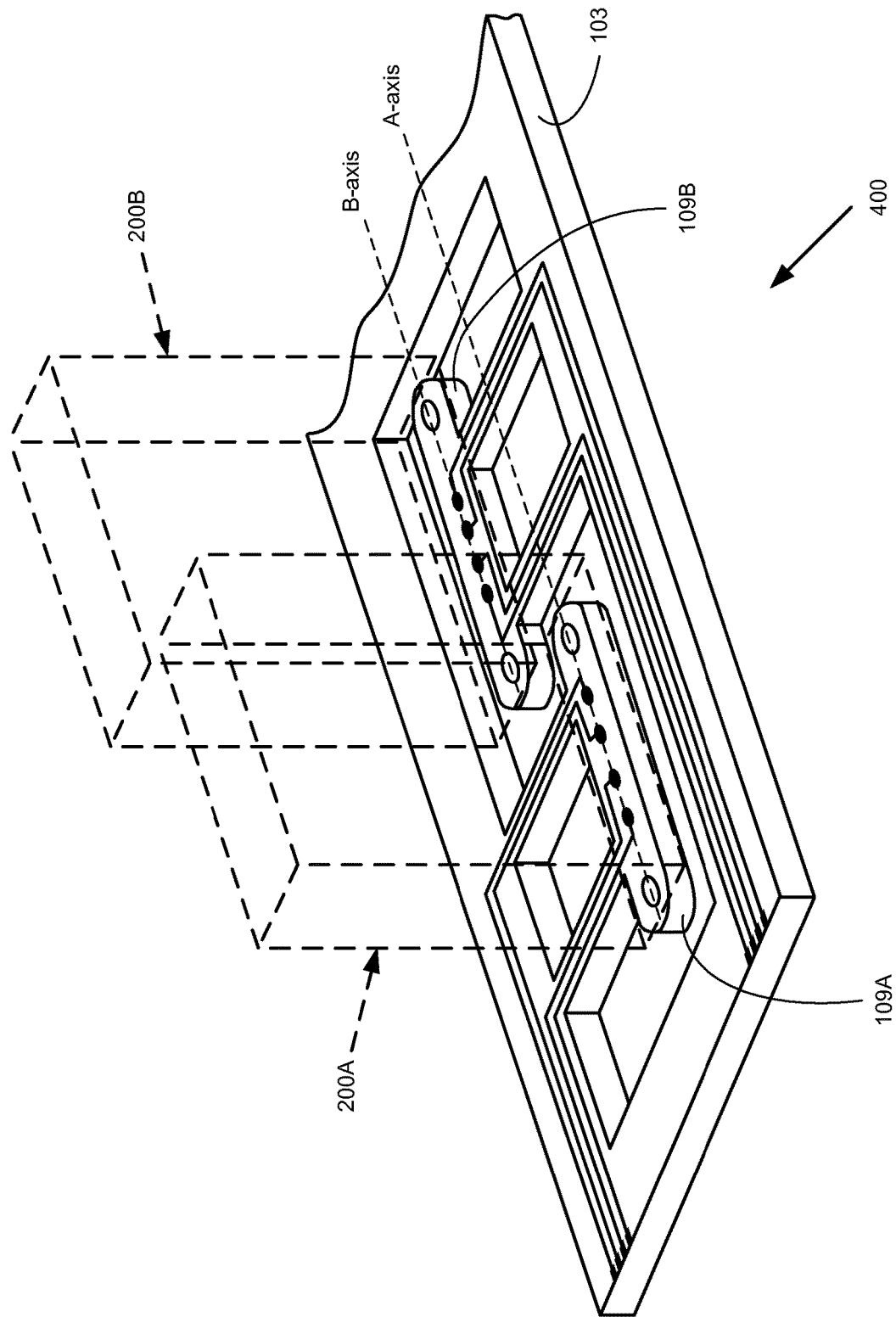
FIG. 5 shows the backplane of FIG. 4 wherein a pair of mating electrical component have been received by two connector islands.

FIG. 5 shows the backplane 100 of FIG. 4 wherein a pair of mating electrical components 200 have been received by two connector islands 109. An electrical component 200A has been received by the connector island 109A. An electrical component 200B has been received by the connector island 109B. The electrical component 200A and the electrical component 200B can be similar or different electrical components. The electrical component 200A and the electrical component 200B are spaced apart and substantially parallel.

Figure 6:
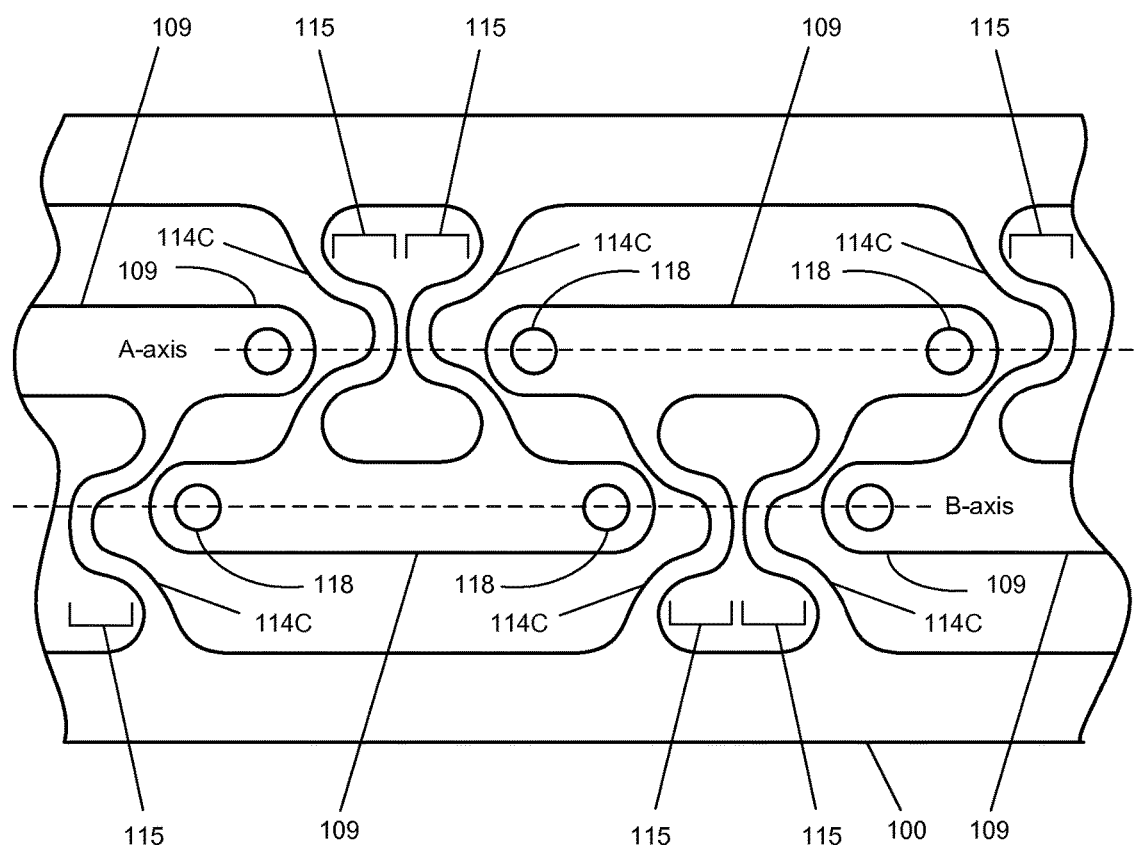
FIG. 6 shows an exemplary backplane wherein each connector island includes two spring elements.

FIG. 6 shows an exemplary backplane 100 wherein each connector island 109 includes two spring elements 114C. The two spring elements 114C in this example are curved and include substantially central loop portions 115. In some examples, the two centrally-extending loop portions 105 have a substantially common loop axis. In other examples, the two centrally-extending loop portions 115 have different loop axes. The shapes of the two spring elements 114C together form a substantially hourglass shape between each connector island 109 and the substrate 103. The shapes of the two spring elements 114C provide flexibility to each connector island 109, wherein the connector islands 109 can vibrate or be displaced relative to the substrate 103.

Further, the substantially hourglass shape of each pair of spring elements 114C provides clearance for adjacent connector islands 109 aligned along the other axis. The shape of each pair of spring elements 114C in this example therefore allows a denser packing of the connector islands 109.

The two spring elements 114C include upper transition regions and lower transition regions where the two spring elements 114C join to either a connector island 109 or to the substrate 103. The upper and lower transition regions of a left spring element 114C are spaced-apart from the upper and lower transition regions of a right spring element 114C. Consequently, there is little possibility of the two ends of a connector island 109 twisting or moving out of phase with each other.

Figure 7:
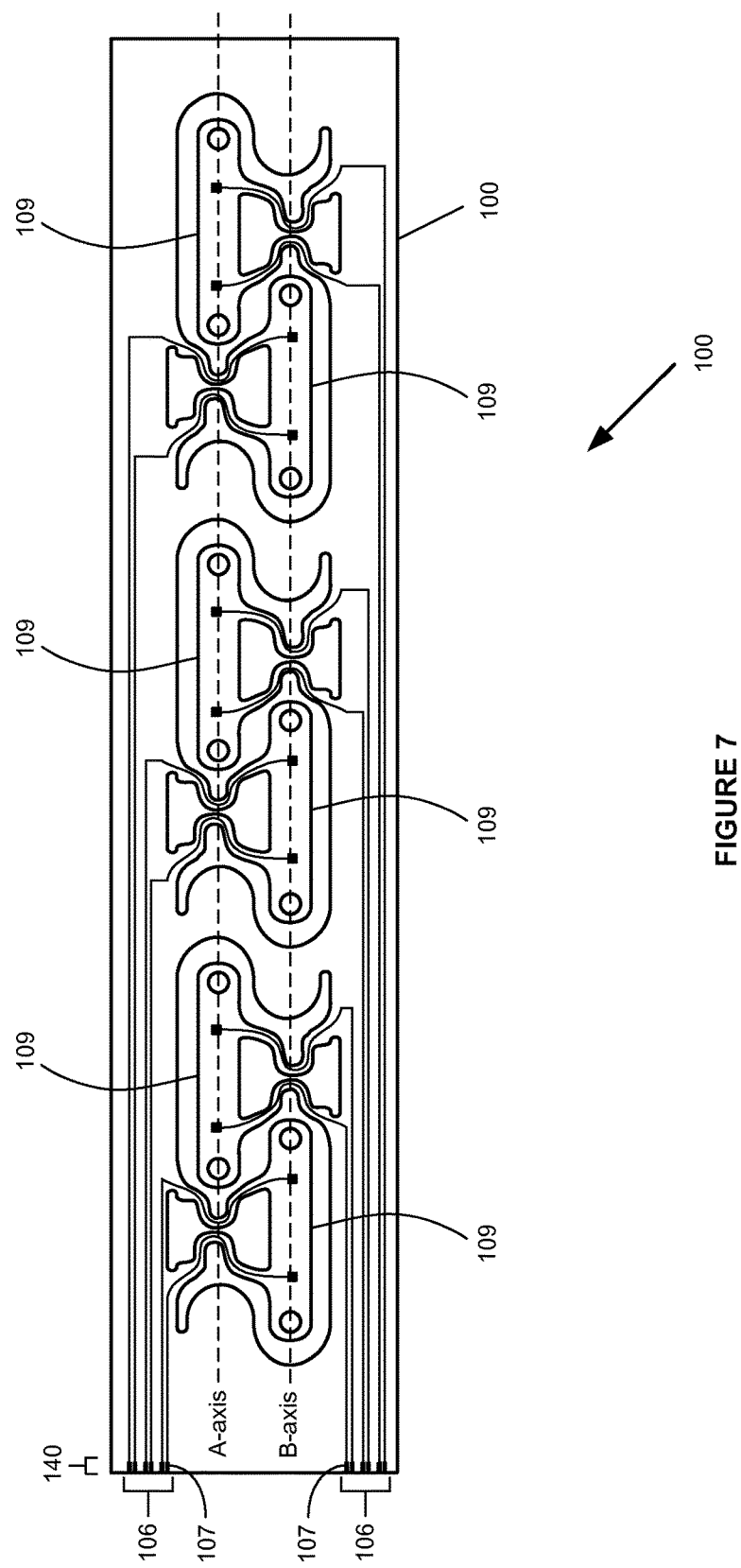
FIG. 7 shows an exemplary backplane that is substantially rectangular in shape.

FIG. 7 shows an exemplary backplane 100 that is substantially rectangular in shape. The backplane 100 in this example includes three pairs of connector islands 109 along two laterally spaced axes. The backplane 100 in this example further includes the plurality of backplane traces 106, wherein an upper portion of the traces 106 extend above the series of connector islands 109 and wherein a lower portion of the traces 106 extend below the series of connector islands 109. In the example, the upper traces lead to the connector islands 109 that are located along the B-axis and the lower traces lead to the connector islands 109 located along the A-axis.

Figure 13:
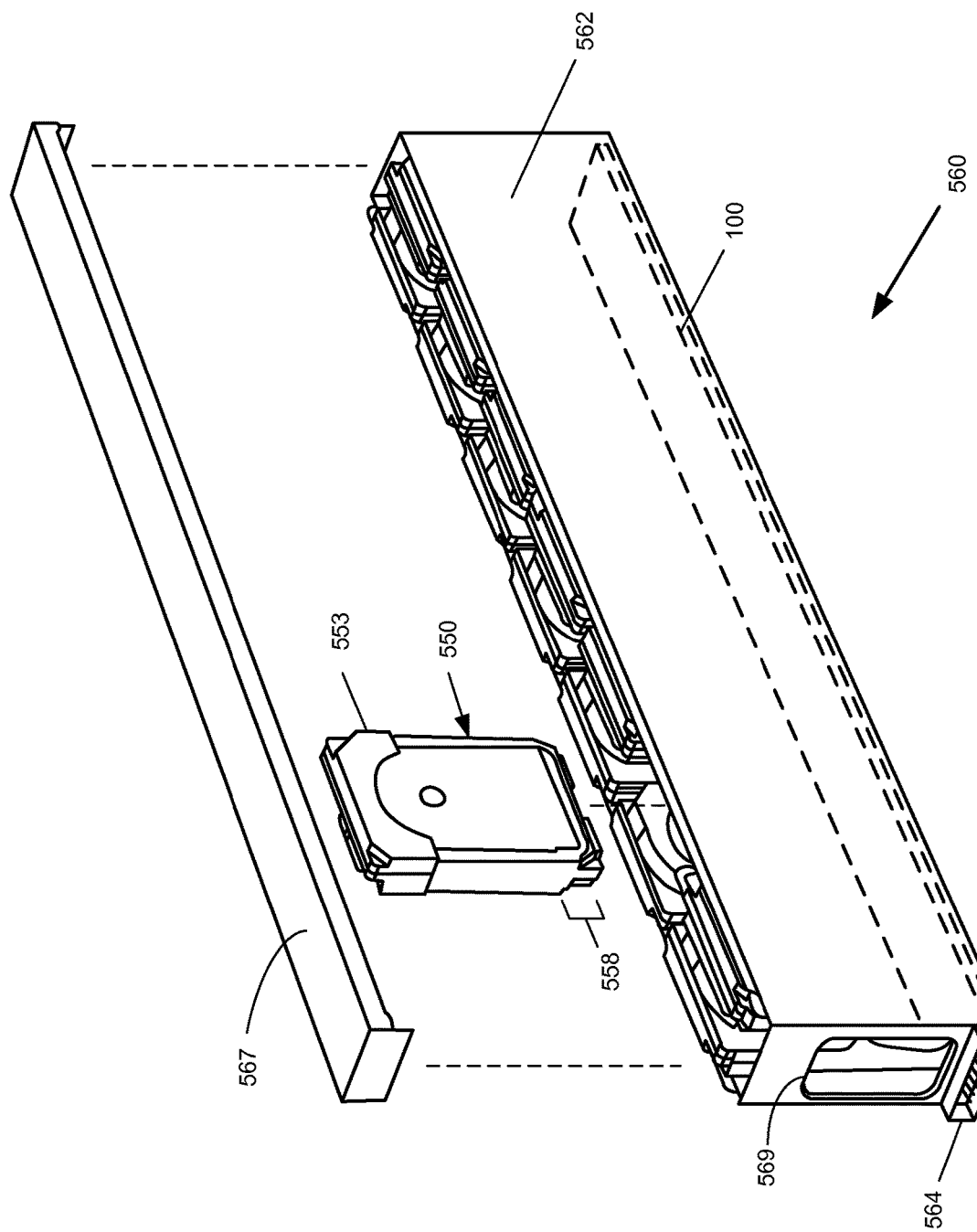
FIG. 13 shows detail of an exemplary component cartridge.

A backplane connector 564 can be affixed to the backplane connector region 140 (see FIG. 13). Individual conductors of the backplane connector 564 can be affixed to the backplane trace pads 107, wherein the backplane connector 564 can be coupled to the plurality of backplane traces 106.

Figure 8:
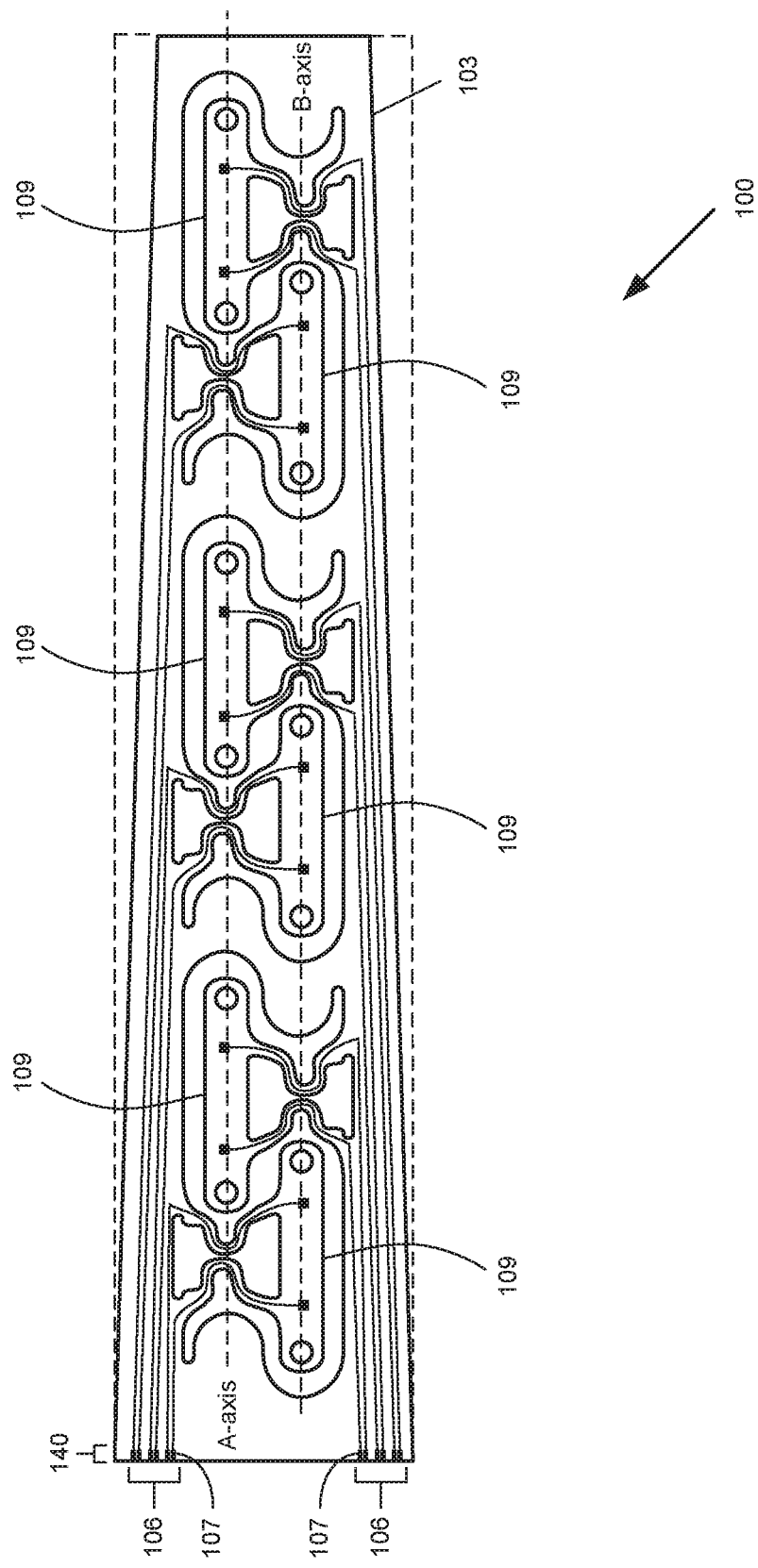
FIG. 8 shows an exemplary backplane that is substantially trapezoidal in shape.

FIG. 8 shows an exemplary backplane 100 that is substantially trapezoidal in shape. Dashed lines show a comparison to the rectangular backplane shape of FIG. 7. Because the number of upper and lower traces is greatest on the left side of the backplane 100 and the number of traces is least on the right side of the figure, the substrate does not have to be uniformly rectangular in shape. Therefore, the plurality of backplane traces 106 are graduated in arrangement, wherein a farthest connector island traces (the connector islands on the right in the figure) are on an outside of a grouping of traces. In this example, the outside traces comprise the uppermost and lowermost traces. Therefore, the plurality of backplane traces 106 are staggered in arrangement, with the connector island traces closest to the backplane connector region 140 comprising inner traces of a grouping of traces.

Further, the plurality of backplane traces 106 can be angled, as shown. The angling of the plurality of backplane traces 106 minimizes a needed area of the substrate 103.

In some examples, the plurality of backplane traces 106 are graduated in arrangement, wherein a farthest connector island traces are on an outside of a grouping of traces. In some examples, the plurality of backplane traces 106 are staggered in arrangement, with connector island traces closest to the backplane connector region 140 comprising inner traces of a grouping of traces.

Figure 9:
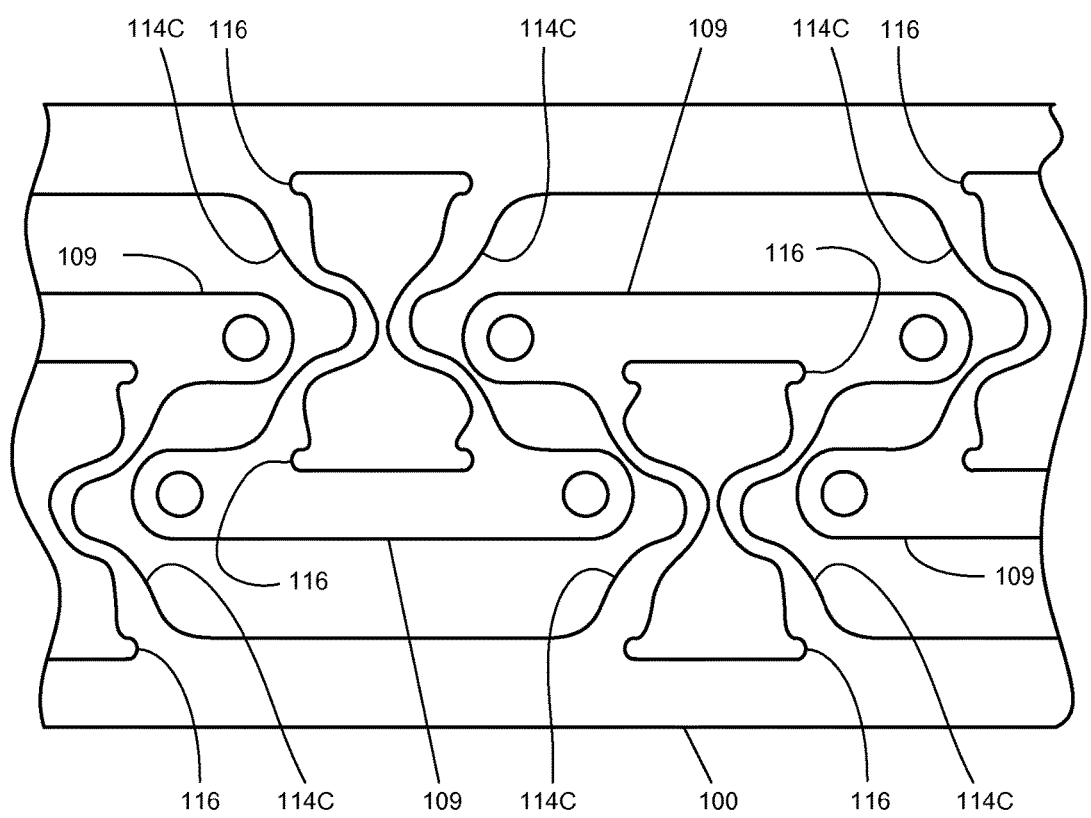
FIG. 9 shows the backplane where the two spring elements of each connector island include a cut-out where the two spring elements join the substrate.

FIG. 9 shows the backplane 100 where the two spring elements 114C of each connector island 109 include a cut-out 116 where the two spring elements 114C join the substrate 103. The cut-outs 116 function to reduce a width of a spring element 114C at the point where the two spring elements 114C join the substrate 103. The cut-outs 116 function to increase an effective length of the two spring elements 114C. The cut-outs 116 therefore increase the flexibility of the spring elements 114C.

Figure 10:
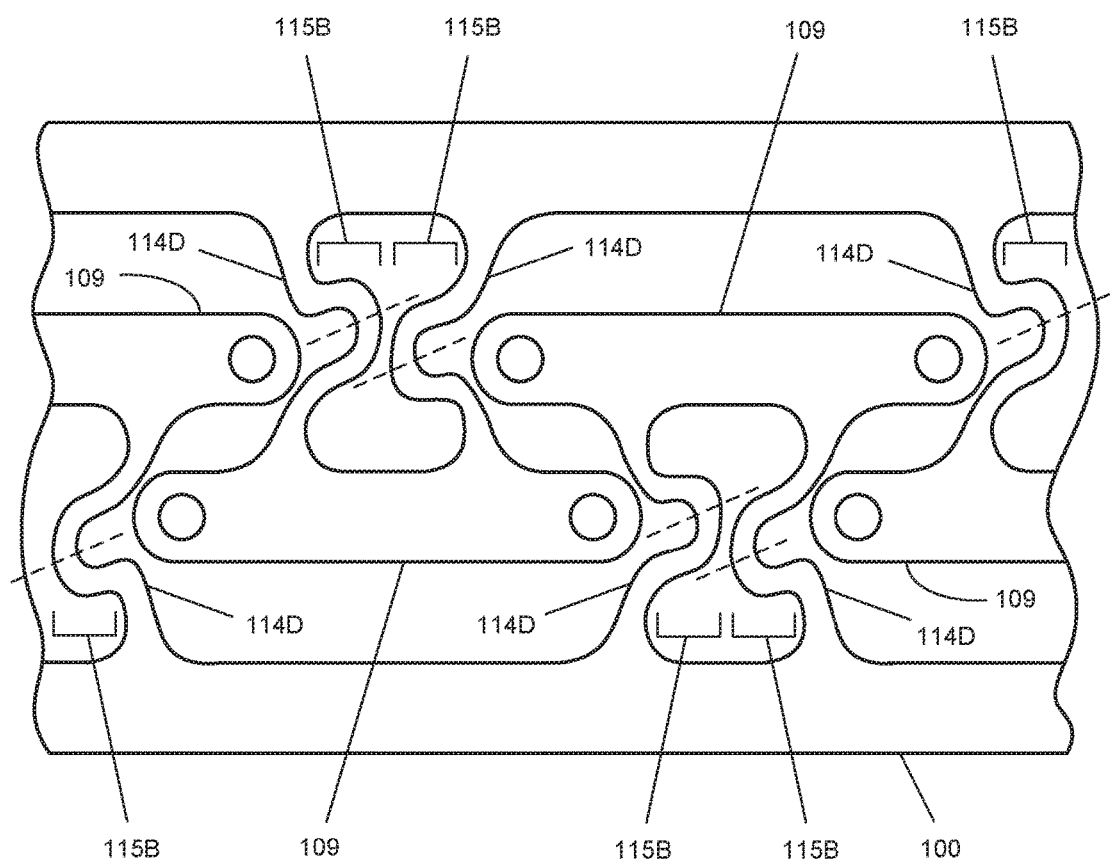
FIG. 10 shows the backplane wherein each spring element includes an angled central loop portion.

FIG. 10 shows the backplane 100 wherein each spring element 114D includes an angled centrally-extending loop portion 115B. The centrally-extending loop portions 115B can be angled in order to affect flexibility of the spring elements 114D. Alternatively, or in addition, the centrally-extending loop portions 115B can be angled in order to pack the centrally-extending loop portions 115B closer together in a given area.

In this example, the two centrally-extending loop portions 115B have different loop axes. The two loop axes can be non-parallel. Alternatively, the two loop axes can be parallel but spaced apart, as shown.

Figure 11:
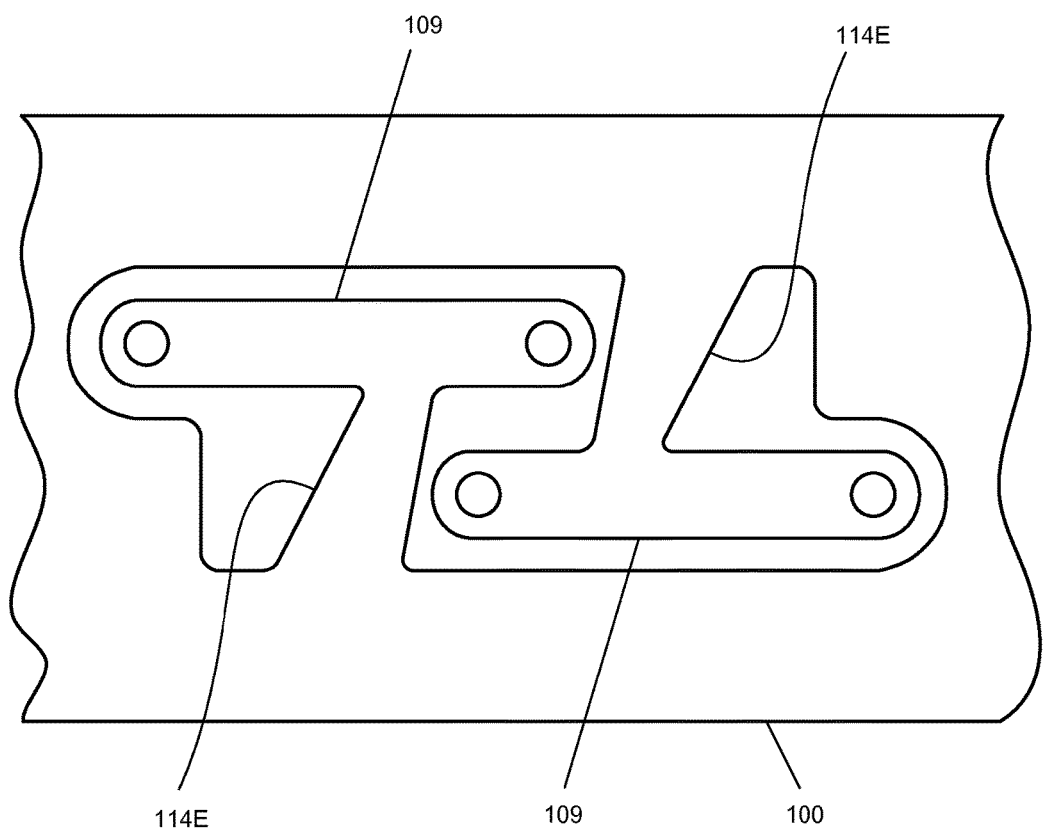
FIG. 11 shows the backplane wherein each connector island is bridged to the substrate by only a single spring element.

FIG. 11 shows the backplane 100 wherein each connector island 109 is bridged to the substrate 103 by only a single spring element 114E. The spring elements 114E are angled in the example.

Figure 12:
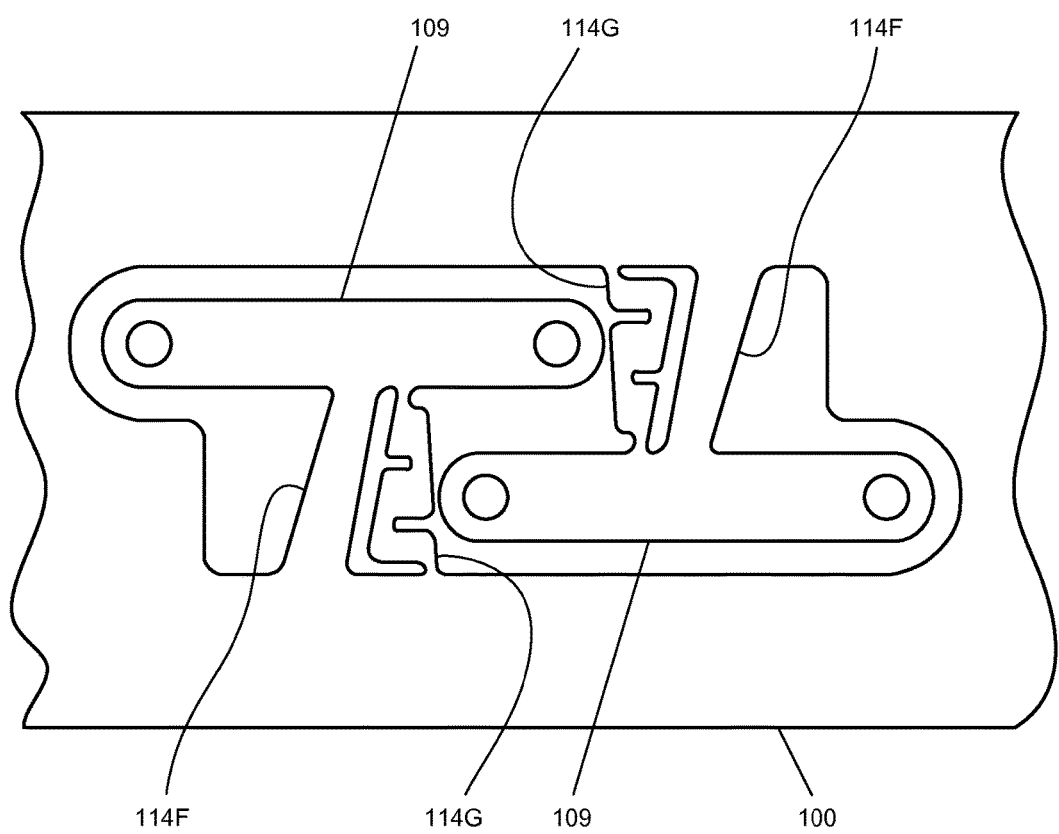
FIG. 12 shows the backplane wherein each connector island is bridged by an angled spring element in combination with a serpentine spring element.

FIG. 12 shows the backplane 100 wherein each connector island 109 is bridged by an angled spring element 114F in combination with a serpentine spring element 114G. The shape of the serpentine spring element 114G provides improved flexibility. The serpentine spring element 114G is spaced-apart from the angled spring element 114F.

FIG. 13 shows detail of an exemplary component cartridge 560. The component cartridge 560 includes a cartridge shell 562, a backplane connector 564, a cartridge lid 567, and one or more electrical components 550 installed in the cartridge shell 562. In some examples, the electrical components 550 comprise HDDs.

Each electrical component 550 includes a mating end 558. At least a portion of the mating end 558 couples to a corresponding connector component 122 affixed to the backplane 100. Each HDD electrical component 550 can include a component cap 553. A component cap 553 can include one or more predefined shapes or features that fit to a corresponding shape or shapes in an interior of the cartridge lid 567.

The interior surface of the cartridge shell 562 can include any manner of guide or alignment mechanisms or features for receiving the plurality of electrical components 550. The interior surface of the cartridge shell 562 can include any manner of attachment or hold-down mechanisms or features for receiving the plurality of electrical components 550. It should be understood that the component cartridge 560 can be used with any number of installed electrical components 550. Further, the exterior surface of the cartridge shell 562 can include mechanisms or features for installing the cartridge shell 562 into a storage sled 500 (or other receptacle or structure designed for receiving and operating component cartridges 560).

The cartridge shell 562 includes cooling windows 569 on the ends. The cooling windows 569 allow air to move lengthwise through the component cartridge 560. The cooling airflow can travel around and/or through the individual electrical components 550 installed in the component cartridge 560.

The backplane connector 564 is affixed to a backplane 100 that extends along a bottom region of the cartridge shell 562 in the example shown. Consequently, the plurality of backplane traces 106 are coupled to the backplane connector 564. The backplane connector 564 can couple to a corresponding connector of the sled head 520 of a storage sled 500 when the component cartridge 560 is installed into the storage sled 500.

Figure 14:
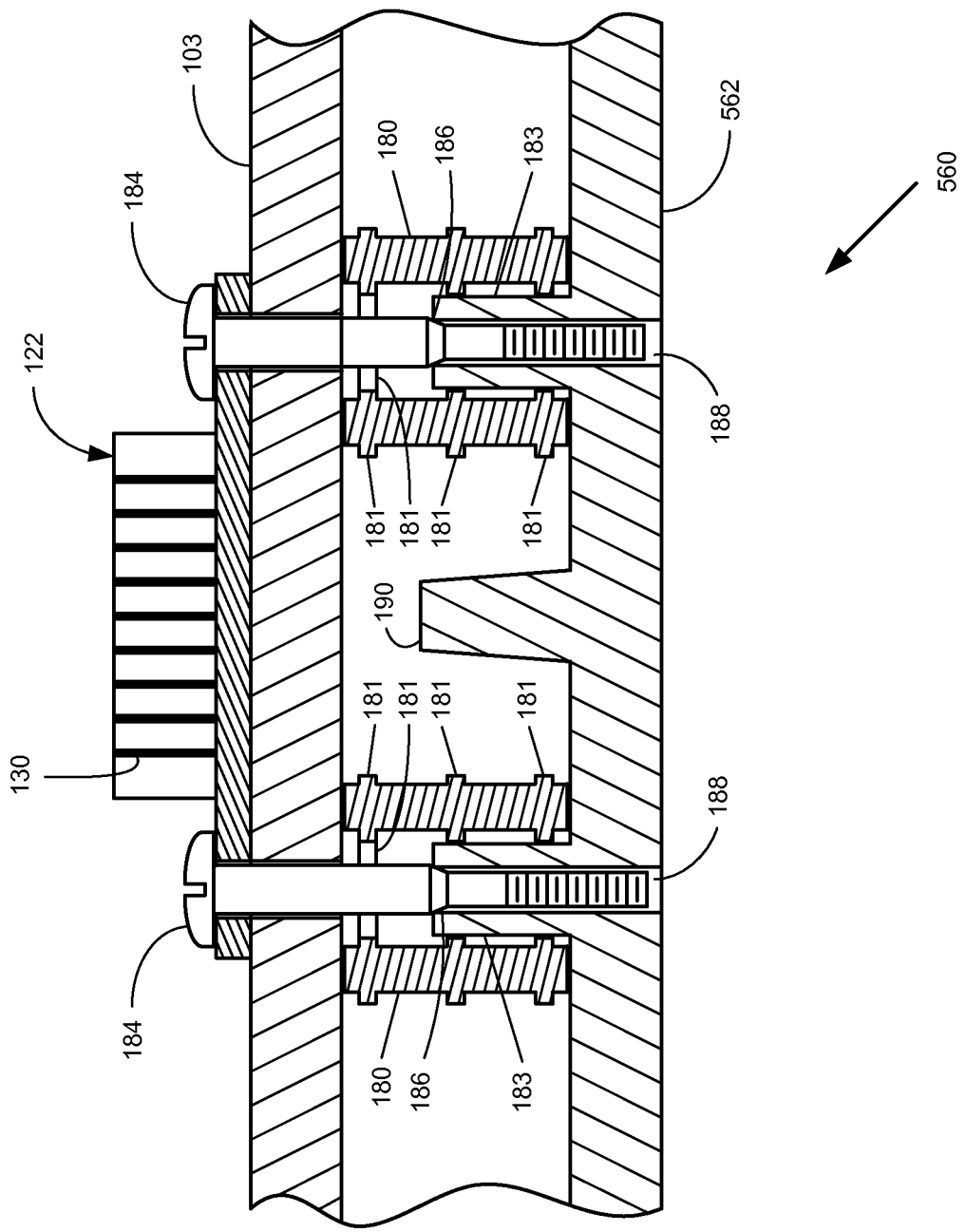
FIG. 14 shows a partial cut-away view of the backplane when the backplane has been installed into a cartridge shell.

FIG. 14 shows a partial cut-away view of the backplane 100 where the backplane 100 is installed into a cartridge shell 562. A connector component 122 has been affixed to the backplane 100 by fasteners 184, including threaded fasteners 184, for example. Multiple projections 183 extend up from a bottom surface of the cartridge shell 562. A projection 183 includes a bore 188 that receives a fastener 184. The fastener 184 in some examples includes a shoulder 186 that positions the fastener 184 a predetermined height above the bottom surface of the cartridge shell 562. The fastener 184 therefore holds the backplane 100 in position in the cartridge shell 562 at the predetermined height. The backplane 100 cannot be flexed or displaced upwards any farther than the limit provided by the fastener 184. However, the backplane 100 is allowed to be flexed or displaced downward.

A compressible damper element 180 fits over a projection 183 and is held in position by the projection 183 and a corresponding fastener 184. A damper element 180 can include one or more ribs 181. The one or more ribs 181 can be located on one or both of an interior surface and an exterior surface of the damper element 180. The backplane 100 can rest on the damper element 180. Alternatively, the backplane 100 can be displaced downward into contact with the damper element 180. Further, the backplane 100 can compress the damper element 180. The damper element 180 therefore can absorb vibration or displacement of at least a local region of the backplane 100.

The figure also shows a limiter projection 190 extending upward from the bottom surface of the cartridge shell 562. The limiter projection 190 is of a predetermined height (not to scale, minimized here for clarity) and is configured to limit the downward displacement of the backplane 100. The limiter projection 190 therefore limits the downward amplitude of vibration or displacement of the backplane 100. In addition, the limiter projection 190 prevents over-flexing of the backplane 100 when electrical components 550 are being pushed down into the component cartridge 560 during electrical component installation.

Figure 15:
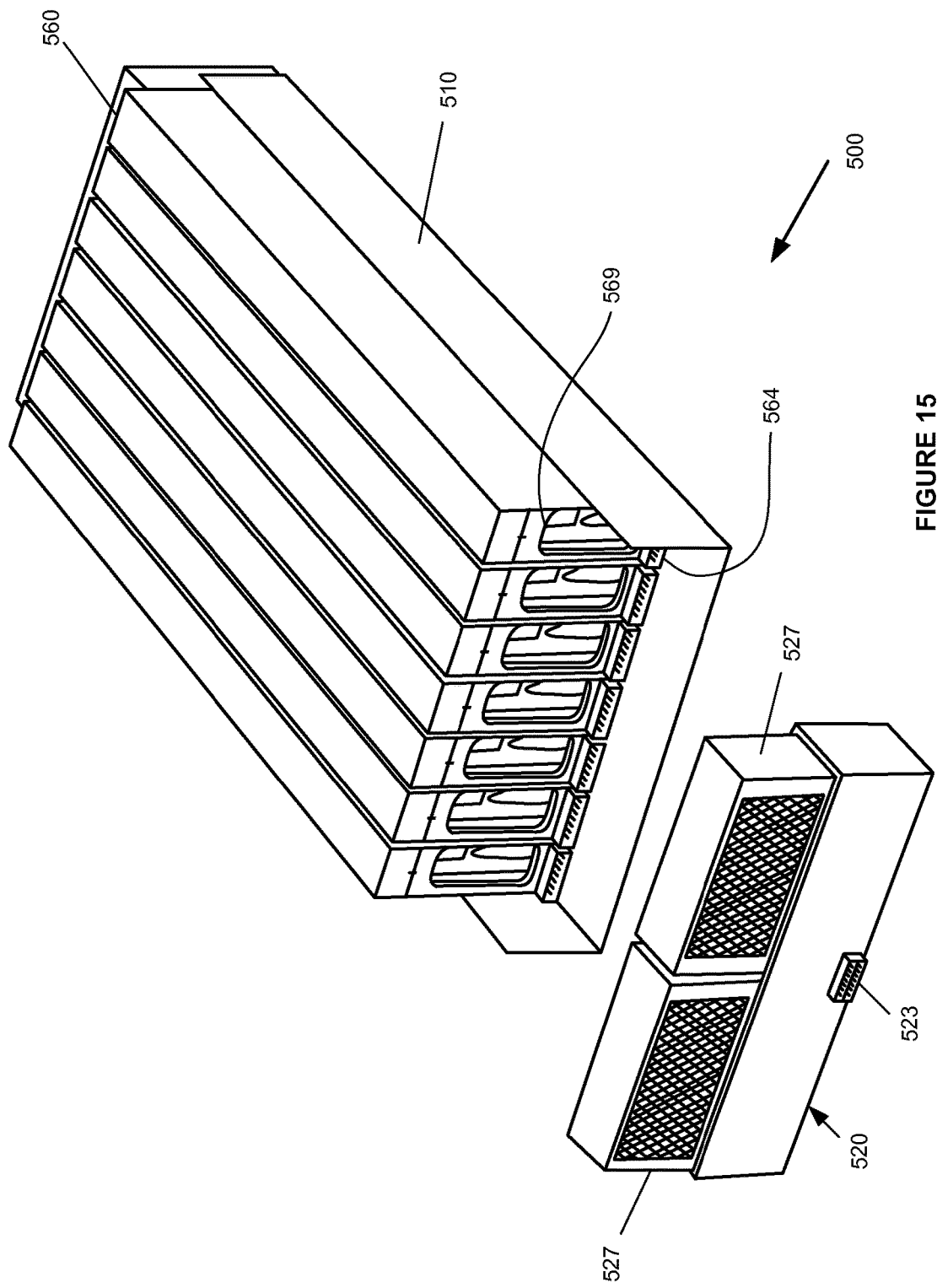
FIG. 15 shows an exemplary storage sled.

FIG. 15 shows an exemplary storage sled 500. In this example, the storage sled 500 includes a sled tray 510, a sled head 520, and a plurality of component cartridges 560 installed in the sled tray 510. In some examples, the component cartridges 560 include one or more HDDs.

The assembled storage sled 500 comprises a modular storage system. The storage sled 500 can be quickly and easily installed to (or removed from) a data storage system. The storage sled 500 is substantially self-contained, wherein electrical power and data exchange can be accomplished through the sled connector 523.

The interior surface of the sled tray 510 can include any manner of guide or alignment mechanisms or features for receiving the plurality of component cartridges 560. The interior surface of the sled tray 510 can include any manner of attachment or hold-down mechanisms or features for receiving the plurality of component cartridges 560. It should be understood that the storage sled 500 can be used with any number of component cartridges 560 installed. Further, the exterior surface of the sled tray 510 can include mechanisms or features for installing the storage sled 500 to a rack, system, or other receptacle or structure.

The sled head 520 can be permanently or removably affixed to the sled tray 510 to complete the assembled storage sled 500. The sled head 520 in the example shown includes a sled connector 523 and one or more sled cooling units 527.

The sled connector 523 is configured to couple to an external bus, network, or system. The sled connector 523 is coupled to a plurality of individual cartridge connectors (not shown) that couple to a backplane connector 564. The sled connector 523 provides electrical power to the plurality of component cartridges 560 in some examples. The sled connector 523 exchanges signals or communications between the plurality of component cartridges 560 and one or more external devices or systems. The sled connector 523 therefore includes suitable communication links, including electrical, optical, or other suitable communication links for transferring digital data.

The one or more cooling units 527 in one example comprise fan units that move air through the plurality of component cartridges 560. However, the one or more cooling units 527 can comprise any suitable cooling devices.

Figure 16:
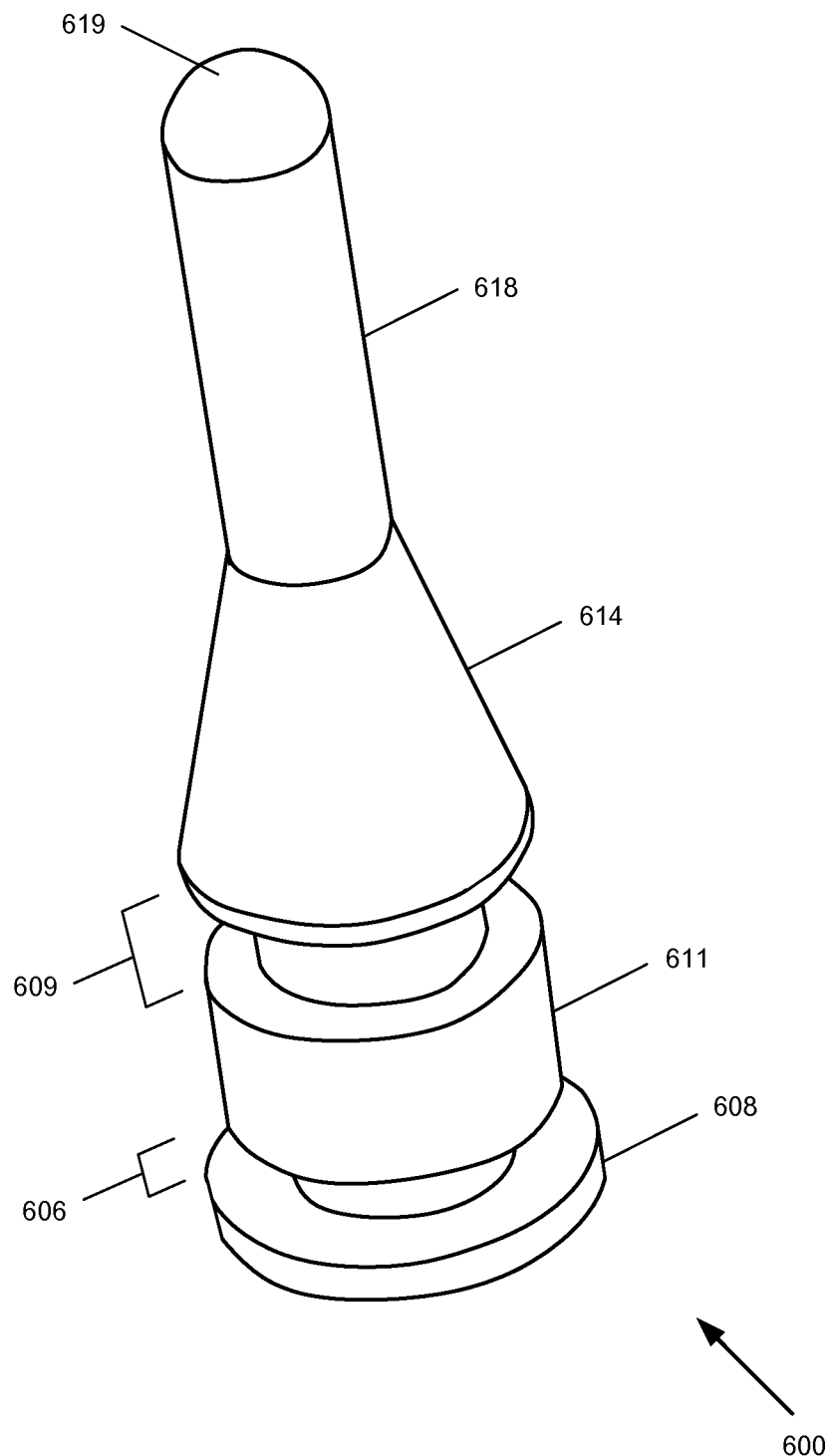
FIG. 16 shows a retainer post in one example.

FIG. 16 shows a retainer post 600 in one example. The retainer post 600 can be used to affix a connector component 122 to a backplane 100. The retainer post 600 in this example includes a head portion 608, a cylindrical portion 611, a conical portion 614, a shaft portion 618, and a rounded tip 619. A first neck portion 606 separates the cylindrical portion 611 from the head portion 608. A second neck portion 609 separates the conical portion 614 from the cylindrical portion 611.

The retainer post 600 can be formed of any suitable material. In some examples, the retainer post 600 is formed of an at least partially flexible or resilient material, such as rubber or a rubber-type material. The retainer post 600 can be formed of a material that absorbs shocks, such as shocks due to insertion or removal of electrical components 200 to the backplane 100, for example. The retainer post 600 can be formed of a material that absorbs vibrations, such as vibrations due to the operation of an electrical component or components 200.

The retainer post 600 can be at least partially deformed during installation. The first neck portion 606 is configured to fit or snap to an aperture 563 in the sled bottom 562 (see FIG. 18). The aperture 563 can include a countersink that receives the head portion 608 of the retainer post 600. The conical portion 614 and the cylindrical portion 611 may be deformed during insertion of the retainer post 600 into the aperture 563 of the sled bottom 562, wherein the deformation is released when the first neck portion 606 is moved into position in the aperture 563 and wherein the cylindrical portion 611 and the head portion 608 hold the first neck portion 606 in position in the aperture 563.

The second neck portion 609 is configured to fit or snap to a connector bore 118 of the backplane 100. The conical portion 614 may be deformed during insertion of the retainer post 600 into the connector bore 118, wherein the deformation is released when the second neck portion 609 is moved into position in the connector bore 118. The conical portion 614 and the cylindrical portion 611 hold the retainer post 600 in position in the connector bore 118. The connector component 122 may be already affixed to the backplane 100, or may be affixed after the backplane 100 has received the retainer post 600. The retainer post 600 can be at least partially deformed during installation of the connector component 122 to the retainer post 600.

Figure 17:
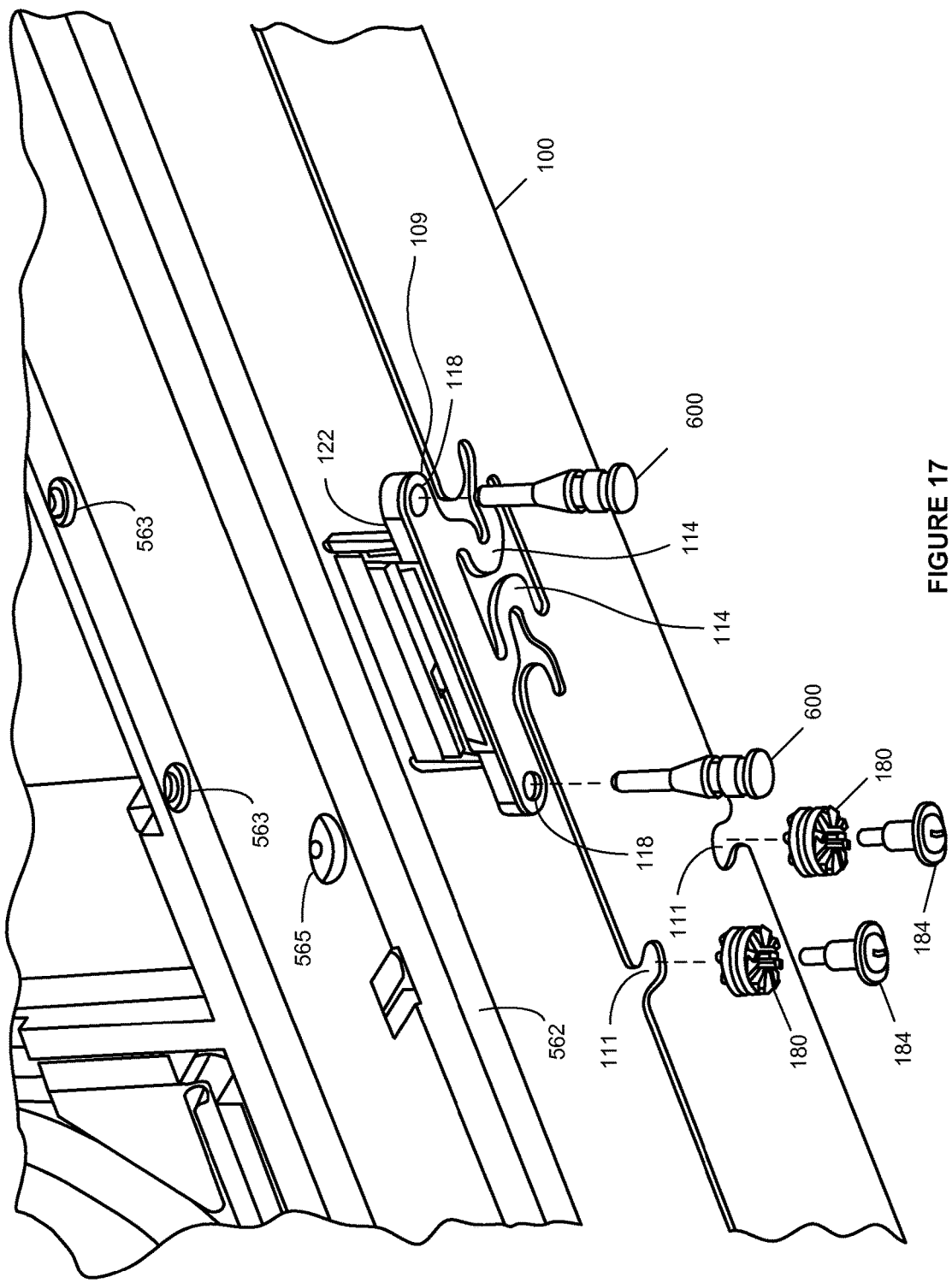
FIGS. 17 and 18 show two retainer posts being assembled to the backplane and the connector component.
Figure 18:
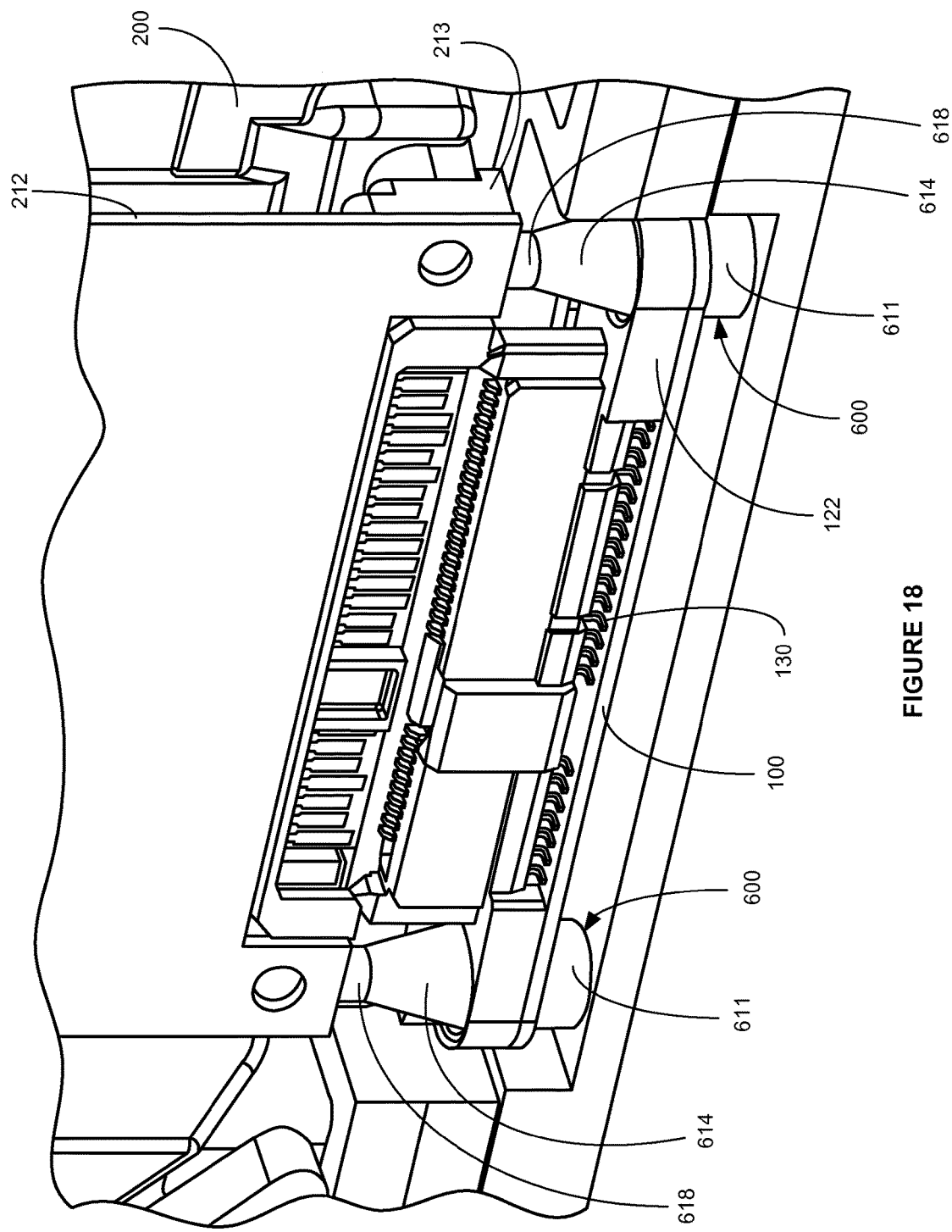

FIGS. 17 and 18 show two retainer posts 600 being assembled to the backplane 100 and the connector component 122. The connector component 122 is in position on a connector island 109 of the backplane 100. The connector component 122 in the example shown includes a plurality of conductors 130 that extend from the connector component 122 and are configured to be soldered (or otherwise affixed) to corresponding pads 116 on the connector island 109, for example. Connector bores 124 of the connector component 122 align with connector bores 118 in the connector island 109. The two connector retainers 600 are inserted into the corresponding combined bores 118 and 124, with the head portion 608 remaining on the underside of the backplane 100. The assembled backplane 100 can then be affixed to a sled bottom 562 (shown here above the backplane 100, but will be below the backplane 100 when assembled, as shown in FIG. 18).

In the figure, an electrical component 200, such as a HDD 200, is coupled to an electrical component connector 213. The electrical component connector 213 is in turn affixed to an electrical component board 212. In addition to coupling to the electrical component 200, the electrical component connector 213 couples to the connector component 122 affixed to the backplane 100.

When fully assembled, the backplane 100 is held above the sled bottom 562 and is spaced-apart from the sled bottom 562 by the cylindrical portions 611 of the two retainer posts 600. The electrical component connector 213 fits at least partially down over the shaft portions 618 of the two retainer posts 600. The electrical component connector 213 can include appropriately sized bores that fit over the shaft portions 618 of the two retainer posts 600. The electrical component connector 213 may or may not fit down far enough onto the two retainer posts 600 to fit at least partially against the conical portions 614.

FIG. 17 also shows the damper elements 180 installed between the backplane 100 and the sled bottom 562 to further absorb vibrations of the backplane 100. Fasteners 184 hold the damper elements 180 in position in apertures or cut-outs 565 in the backplane 100.

While the present invention has been particularly shown and described with reference to the preferred implementations, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A backplane configured to receive electrical components, comprising:
    a substantially planar substrate comprising an at least partially flexible material and formed in a non-rectangular shape;
    a series of alternating connector islands formed along two substantially parallel axes extending substantially lengthwise on the substrate and wherein each connector island is able to move independently of other connector islands, with pairs of connector islands of the series of connector islands located in openings in the substrate and configured to receive one or more mating electrical components;
    a plurality of backplane traces formed as part of the substrate, with the plurality of backplane traces extending from the series of alternating connector islands to a backplane connector region of the substrate, with a number of backplane traces increasing closer to the backplane connector region; and
    one or more spring elements bridging between a particular connector island and the substrate, with traces of the plurality of backplane traces extending over the one or more spring elements to the particular connector island and with the one or more spring elements allowing the particular connector island to flex with respect to the substrate and absorb vibrations.

2. The backplane of claim 1, with the plurality of backplane traces graduated in arrangement, wherein traces extending from a farthest connector island are on an outside of a grouping of traces.

3. The backplane of claim 1, with the plurality of backplane traces staggered in arrangement, with connector island traces closest to the backplane connector region comprising inner traces of a grouping of traces.

4. The backplane of claim 1, with a first connector island of a first axis being laterally spaced from an adjacent second connector island of a second axis.

5. The backplane of claim 1, with the one or more spring elements comprising two spring elements, wherein the two spring elements form a substantially hourglass shape including centrally-extending loop portions, wherein the two centrally-extending loop portions have a substantially common loop axis.

6. The backplane of claim 1, with the one or more spring elements comprising two spring elements, wherein the two spring elements form a substantially hourglass shape including centrally-extending loop portions, wherein the two centrally-extending loop portions have different loop axes.

7. The backplane of claim 1, further comprising a cut-out slot located at a junction of the one or more spring elements and the substrate.

8. The backplane of claim 1, further comprising one or more damper elements positioned underneath the backplane and configured to absorb deflections of the backplane.

9. The backplane of claim 1, further comprising one or more limiter projections positioned underneath the backplane and configured to limit amplitudes of deflections of the backplane.

10. A backplane configured to receive electrical components, comprising:
    a substantially planar substrate comprising an at least partially flexible material and formed in a substantially trapezoidal shape;
    a series of alternating connector islands formed along two substantially parallel axes extending substantially lengthwise on the substrate and wherein each connector island is able to move independently of other connector islands, with pairs of connector islands of the series of connector islands located in openings in the substrate and configured to receive one or more mating electrical components;
    a plurality of backplane traces formed as part of the substrate, with the plurality of backplane traces extending from the series of alternating connector islands to a backplane connector region of the substrate, with a number of backplane traces increasing closer to the backplane connector region; and
    one or more spring elements bridging between a particular connector island and the substrate, with traces of the plurality of backplane traces extending over the one or more spring elements to the particular connector island and with the one or more spring elements allowing the particular connector island to flex with respect to the substrate and absorb vibrations.

11. The backplane of claim 10, with the plurality of backplane traces graduated in arrangement, wherein traces extending from a farthest connector island are on an outside of a grouping of traces.

12. The backplane of claim 10, with the plurality of backplane traces staggered in arrangement, with connector island traces closest to the backplane connector region comprising inner traces of a grouping of traces.

13. The backplane of claim 10, with a first connector island of a first axis being laterally spaced from an adjacent second connector island of a second axis.

14. The backplane of claim 10, with the one or more spring elements comprising two spring elements, wherein the two spring elements form a substantially hourglass shape including centrally-extending loop portions, wherein the two centrally-extending loop portions have a substantially common loop axis.

15. The backplane of claim 10, with the one or more spring elements comprising two spring elements, wherein the two spring elements form a substantially hourglass shape including centrally-extending loop portions, wherein the two centrally-extending loop portions have different loop axes.

16. The backplane of claim 10, further comprising a cut-out slot located at a junction of the one or more spring elements and the substrate.

17. The backplane of claim 10, further comprising one or more damper elements positioned underneath the backplane and configured to absorb deflections of the backplane.

18. The backplane of claim 10, further comprising one or more limiter projections positioned underneath the backplane and configured to limit amplitudes of deflections of the backplane.

19. A method of forming a backplane for receiving electrical components, comprising:

providing a substantially planar substrate comprising an at least partially flexible material and formed in a substantially trapezoidal shape;

providing a series of alternating connector islands formed along two substantially parallel axes extending substantially lengthwise on the substrate and wherein each connector island is able to move independently of other connector islands, with pairs of connector islands of the series of connector islands located in openings in the substrate and configured to receive one or more mating electrical components;

providing a plurality of backplane traces formed as part of the substrate, with the plurality of backplane traces extending from the series of alternating connector islands to a backplane connector region of the substrate, with a number of backplane traces increasing closer to the backplane connector region; and providing one or more spring elements bridging between a particular connector island and the substrate, with traces of the plurality of backplane traces extending over the one or more spring elements to the particular connector island and with the one or more spring elements allowing the particular connector island to flex with respect to the substrate and absorb vibrations.

20. The method of claim 19, with providing the plurality of backplane traces comprising: staggering the traces, wherein connector islands closest to the backplane connector region comprise inner traces of a grouping of traces; and angling the grouping of traces to minimize an area of the substrate.

* * * * *